(12) United States Patent
An et al.

(10) Patent No.: US 9,824,173 B1
(45) Date of Patent: Nov. 21, 2017

(54) SOFTWARE DEVELOPMENT-BASED COMPILATION FLOW FOR HARDWARE IMPLEMENTATION

(71) Applicant: Xilinx, Inc., San Jose, CA (US)

(72) Inventors: Bennet An, San Jose, CA (US); Henry E. Styles, Menlo Park, CA (US); Sonal Santan, San Jose, CA (US); Fernando J. Martinez Vallina, Sunnyvale, CA (US); Pradip K. Jha, Cupertino, CA (US); David A. Knol, Morgan Hill, CA (US); Sudipto Chakraborty, Longmont, CO (US); Jeffrey M. Fifield, Boulder, CO (US); Stephen P. Rozum, Loveland, CO (US)

(73) Assignee: XILINX, INC., San Jose, CA (US)

( * ) Notice: Subject to any disclaimer, the term of this patent is extended or adjusted under 35 U.S.C. 154(b) by 171 days.

(21) Appl. No.: 14/852,173

(22) Filed: Sep. 11, 2015

(51) Int. Cl.
*G06F 17/50* (2006.01)

(52) U.S. Cl.
CPC ................ *G06F 17/5054* (2013.01)

(58) Field of Classification Search
CPC .......... G06F 17/5054; G06F 17/5072
USPC ........................................... 716/117
See application file for complete search history.

(56) References Cited

U.S. PATENT DOCUMENTS

| | | | | |
|---|---|---|---|---|
| 6,077,315 A * | 6/2000 | Greenbaum et al. | ......... | 717/157 |
| 6,651,225 B1 * | 11/2003 | Lin et al. | ...................... | 716/113 |
| 8,185,850 B1 * | 5/2012 | Schumacher | ................. | 716/103 |
| 2014/0380287 A1 * | 12/2014 | Carrillo | ......................... | 717/140 |
| 2015/0324509 A1 * | 11/2015 | Xue | .................... | G06F 17/5054 |
| | | | | 716/116 |

OTHER PUBLICATIONS

Specification and drawings for U.S. Appl. No. 14/540,854, filed Nov. 13, 2014, Carrillo et al.

* cited by examiner

*Primary Examiner* — Suchin Parihar
(74) *Attorney, Agent, or Firm* — Kevin T. Cuenot

(57) ABSTRACT

A software development-based compilation flow for circuit design may include executing, using a processor, a makefile including a plurality of rules for hardware implementation. Responsive to executing a first rule of the plurality of rules, a source file including a kernel specified in a high level programming language may be selected; and, an intermediate file specifying a register transfer level implementation of the kernel may be generated using the processor. Responsive to executing a second rule of the plurality of rules, a configuration bitstream for a target integrated circuit may be generated from the intermediate file using the processor. The configuration bitstream includes a compute unit circuit implementation of the kernel.

20 Claims, 7 Drawing Sheets

US 9,824,173 B1

SOFTWARE DEVELOPMENT-BASED COMPILATION FLOW FOR HARDWARE IMPLEMENTATION

TECHNICAL FIELD

This disclosure relates to integrated circuits (ICs) and, more particularly, to a software development-based compilation flow for hardware implementation.

BACKGROUND

Integrated circuits (ICs) may be implemented to perform a variety of functions. Some ICs may be programmed to perform specified functions. One example of an IC that may be programmed is a field programmable gate array (FPGA). An FPGA typically includes an array of programmable tiles. Each programmable tile may include both programmable interconnect circuitry and programmable logic circuitry.

The programmable interconnect and programmable logic circuitries are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function circuit blocks" connected together and to input/output (I/O) resources by an interconnect switch matrix. Each function circuit block of the CPLD may include a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other programmable ICs may be programmed by applying a processing layer, such as a metal layer, that programmably interconnects the various elements on the device. These programmable ICs are known as mask programmable devices. Programmable ICs may also be implemented in other ways, e.g., using fuse or antifuse technology. The phrase "programmable IC" may include, but is not limited to, these devices and further may encompass devices that are only partially programmable. For example, one type of programmable IC includes a combination of hard-coded transistor logic and a programmable switch fabric that programmably interconnects the hard-coded transistor logic.

Creating a circuit design that may be implemented within a programmable IC is largely performed by experienced hardware (e.g., circuit) designers. Circuit design requires specialized knowledge relating to circuits in general, the particular architecture of the programmable IC in which the circuit design is to be implemented (the "target IC"), as well as the particular electronic design automation (EDA) tools that will be used. For example, a circuit designer must understand the many different implementation parameters that are required by the EDA tool to generate a working circuit design and further understand how those parameters influence hardware generation processes such as synthesis, placement, and/or routing. Often, these implementation parameters are EDA tool specific and highly correlated with the architecture of the target IC. In consequence, circuit design has remained out of reach of many users including software developers.

SUMMARY

A method includes executing, using a processor, a makefile including a plurality of rules for hardware implementation and, responsive to executing a first rule of the plurality of rules, selecting a source file including a kernel specified in a high level programming language and generating, using the processor, an intermediate file specifying a register transfer level implementation of the kernel. The method may include, responsive to executing a second rule of the plurality of rules, generating, using the processor, a configuration bitstream for a target integrated circuit from the intermediate file. The configuration bitstream includes a compute unit circuit implementation of the kernel.

A system includes a processor programmed to initiate executable operations. The executable operations may include executing a makefile including a plurality of rules for hardware implementation and, responsive to executing a first rule of the plurality of rules, selecting a source file including a kernel specified in a high level programming language and generating an intermediate file specifying a register transfer level implementation of the kernel. The executable operations may also include, responsive to executing a second rule of the plurality of rules, generating a configuration bitstream for a target integrated circuit from the intermediate file. The configuration bitstream includes a compute unit circuit implementation of the kernel.

A non-transitory computer-readable medium has instructions stored thereon which, when executed by a processor, perform a method. The method may include the various operations described within this disclosure.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
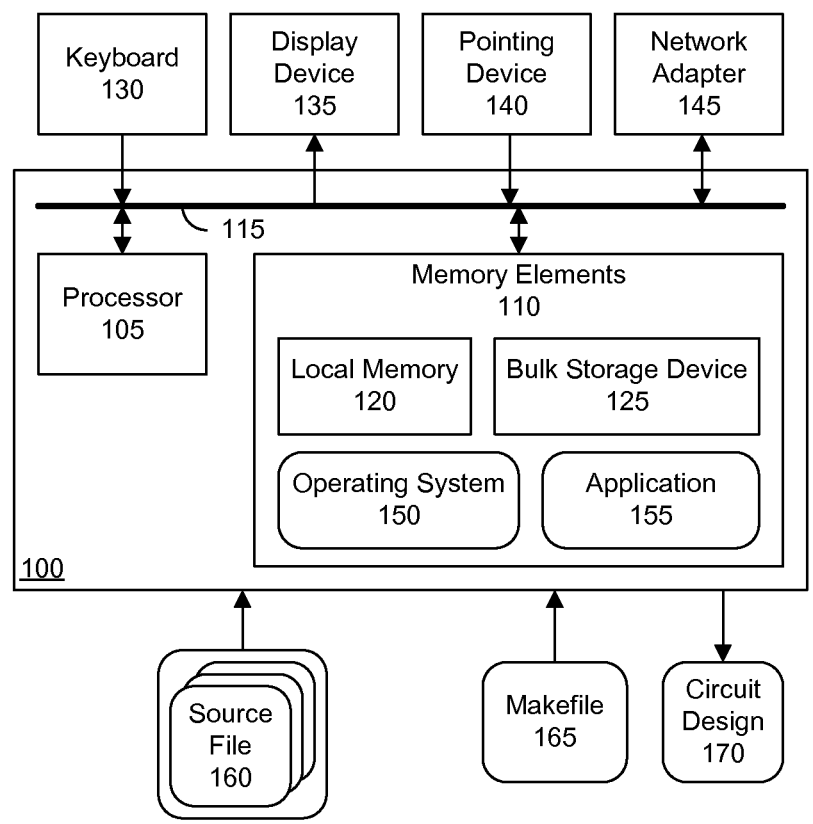
FIG. 1 is a block diagram illustrating an exemplary data processing system.

While the disclosure concludes with claims defining novel features, it is believed that the various features described within this disclosure will be better understood from a consideration of the description in conjunction with the drawings. The process(es) (e.g., methods), machine(s) (e.g., systems), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to a software development-based compilation flow for hardware implementation. In accordance with the inventive arrangements described within this disclosure, a compilation flow for implementing circuit designs is provided. The compilation flow transforms high level program language code into a circuit design, or a portion of a circuit design. Rather than utilize a hardware design paradigm, the inventive arrangements described herein allow users to implement, interact with, and control hardware implementation tools as one would control software development processes.

By using a software development paradigm for hardware implementation, users are no longer required to possess specialized knowledge of hardware design in general, the architecture of the target IC, and/or the peculiarities of hardware design tools. Users may process high level programming language files through a compilation flow. The compilation flow may be invoked and/or controlled using a software development paradigm. For example, a makefile type of development environment for hardware implementation may be used.

In one aspect, the inventive arrangements described herein may be implemented as a method (e.g., a process) performed by a data processing system to implement a circuit design. In another aspect, the inventive arrangements may be implemented as a data processing system having a processor that, upon executing program code, implements a circuit design as described herein. In still another aspect, the inventive arrangements may be implemented as a non-transitory computer-readable storage medium storing program code that, when executed by a processor, causes the processor to perform and/or initiate a method of implementing a circuit design.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating an exemplary data processing system (system) 100. As pictured, system 100 includes at least one processor, e.g., a central processing unit (CPU), 105 coupled to memory elements 110 through a system bus 115 or other suitable circuitry. System 100 stores computer readable program instructions (also referred to as "program code") within memory elements 110. Memory elements 110 may be considered an example of computer readable storage media. Processor 105 executes the program code accessed from memory elements 110 via system bus 115.

Memory elements 110 may include one or more physical memory devices such as, for example, a local memory 120 and one or more bulk storage devices 125. Local memory 120 refers to random access memory (RAM) or other non-persistent memory device(s) generally used during actual execution of the program code. Bulk storage device 125 may be implemented as a hard disk drive (HDD), solid state drive (SSD), or other persistent data storage device. System 100 may also include one or more cache memories (not shown) that provide temporary storage of at least some program code in order to reduce the number of times program code must be retrieved from bulk storage device 125 during execution.

Input/output (I/O) devices such as a keyboard 130, a display device 135, a pointing device 140, and one or more network adapters 145 may be coupled to system 100. The I/O devices may be coupled to system 100 either directly or through intervening I/O controllers. In some cases, one or more of the I/O devices may be combined as in the case where a touchscreen is used as display device 135. In that case, display device 135 may also implement keyboard 130 and pointing device 140. Network adapter 145 may be used to couple system 100 to other systems, computer systems, remote printers, and/or remote storage devices through intervening private or public networks. Modems, cable modems, Ethernet cards, and wireless transceivers and/or radios are examples of different types of network adapter 145 that may be used with system 100. Depending upon the particular implementation of system 100, the specific type of network adapter, or network adapters as the case may be, will vary.

As pictured in FIG. 1, memory elements 110 may store an operating system 150 and one or more applications 155. In one aspect, application 155 may be an electronic design automation (EDA) application. The EDA application may include a make utility configured to initiate and/or control various operations of the EDA application. In another aspect, application 155 may include an EDA application and a separate make utility configured to initiate and/or control operations the EDA application.

Operating system 150 and application 155, being implemented in the form of executable program code, may be executed by system 100 and, in particular, by processor 105. As such, operating system 150 and application 155 may be considered an integrated part of system 100. Operating system 150, application 155, and any data items used, generated, and/or operated upon by system 100 are functional data structures that impart functionality when utilized by system 100.

In one aspect, system 100 may be a computer or other device that is suitable for storing and/or executing program code. System 100 may represent any of a variety of computer systems and/or devices that include a processor and memory and that are capable of performing the operations described within this disclosure. In some cases, the particular computer system and/or device may include fewer components or more components than described. System 100 may be implemented as a single system as shown or as a plurality of networked or interconnected systems each having an architecture the same as, or similar to, that of system 100.

In one aspect, source files 160, taken collectively, may form an OpenCL design. In another aspect, source files 160 may specify one or more kernels of an OpenCL design. OpenCL stands for "Open Computing Language" and is a framework for writing computer programs that may execute across heterogeneous computing platforms. In one aspect, the term "heterogeneous computing platforms" refers to two or more computing platforms, e.g., processors, where at least one computing platform utilizes an instruction set that is different from at least one other computing platform. Exemplary heterogeneous computing platforms may include a CPU and a graphics processing unit (GPU); a CPU and digital signal processor (DSP); a CPU, a GPU, and a DSP; or the like.

The OpenCL design, when compiled, may include executable program code that is executed by a designated host processor such as the CPU. The OpenCL design may also include executable program code that may be referred to as a kernel. The OpenCL design may include one or more kernels that may be offloaded from the host processor to one or more of the other processors, e.g., GPUs, DSPs, etc., for execution, thereby increasing overall execution speed and efficiency.

Another example of heterogeneous computing platforms may include one or more of a CPU, a GPU, a DSP, or other processor that is configured to execute program code in combination with a programmable IC. A field programmable gate array (FPGA) is an example of a programmable IC. In this case, the host executes program code. Further, one or more kernels may be executed by one or more other processors other than the host. One or more kernels, however, also may be implemented as hardware, e.g., as circuitry within the programmable IC. The circuitry of the programmable IC may implement a kernel that operates faster and/or with greater efficiency than had the kernel been executed as program code by one of the processors.

In operation, system 100 may receive one or more source files 160. In one exemplary implementation, each of source files 160 may include high level programming language. The high level programming language may be in the form of source code. As defined herein, the term "source code" means high level programming language code specified in a human readable form that has not undergone compilation (e.g., conversion to object code and/or conversion to register transfer level (RTL) format). Source files 160 may specify one or more kernels.

System 100 also may receive a makefile 165. Makefile 165 may include one or more rules for hardware implementation. In general, system 100 may process source files 160 through a compilation flow where hardware implementation rules of makefile 165 are executed to control operation and/or execution of an EDA application, or EDA applications as the case may be. System 100 may process source files 160 through the compilation flow for hardware implementation and output a circuit design 170. In one exemplary implementation, circuit design 170 may be a configuration bitstream. As used herein, the term "configuration bitstream" may refer to a complete (i.e., full) configuration bitstream or may refer to one or more partial configuration bitstreams.

Figure 2:
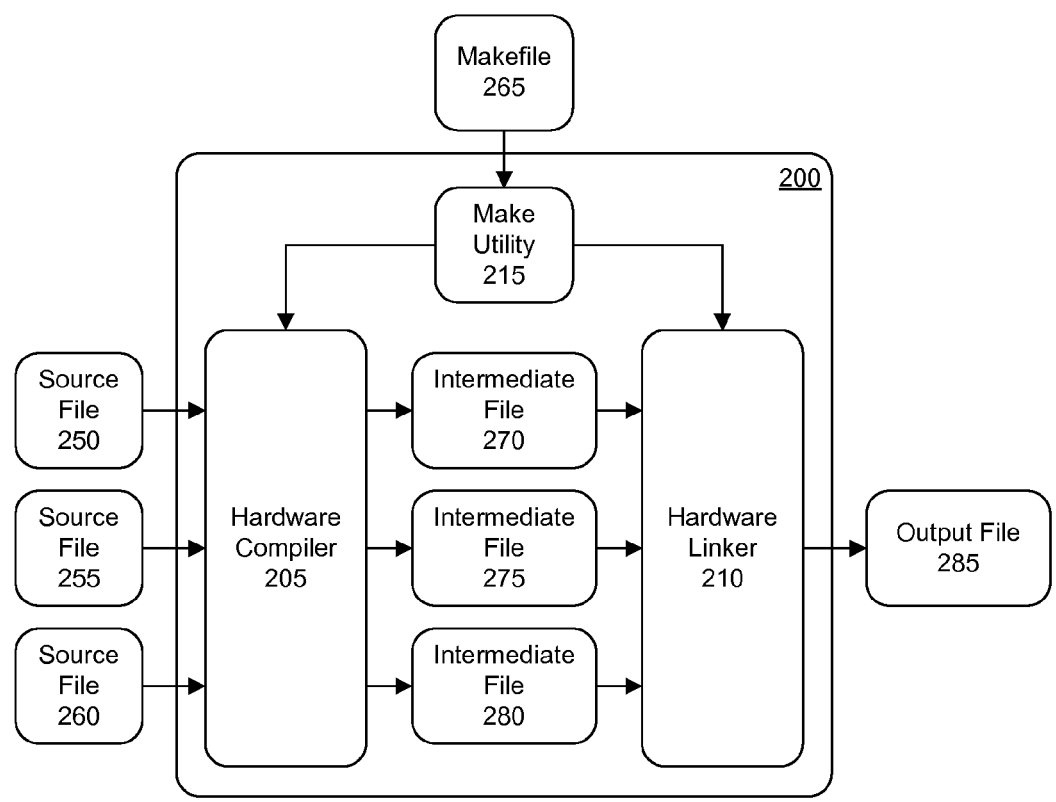
FIG. 2 is a block diagram illustrating an example of a compilation flow for hardware implementation.

FIG. 2 is a block diagram illustrating an example of a compilation flow for hardware implementation. The compilation flow of FIG. 2 may be implemented by the system described with reference to FIG. 1. In one exemplary implementation, EDA application 200 may represent application 155. As pictured, EDA application 200 may include a hardware compiler 205, a hardware linker 210, and a make utility 215. While hardware compiler 205 and hardware linker 210 are represented as being part of a single larger application, in another example, hardware compiler 205 and hardware linker 210 may be implemented as separate applications. Further, make utility 215 may be implemented as a separate application.

EDA application 200 may be controlled and/or operate in a manner similar to software compilation tools. In one aspect, EDA application 200 may be configured to operate as a command line application. For example, hardware compiler 205 and/or hardware linker 210 may be configured to respond to commands or instructions provided by make utility 215 responsive to executing makefile 265.

In one example, a system such as system 100 of FIG. 1 may be executing application 200. A command such as make may be received as a command line input. A more complex form of the command may be typed, for example, if makefile 265 is stored in a different directory than the directory where the make command is typed. Responsive to the make command, make utility 215 may execute makefile 265. In executing makefile 265, make utility 215 may control operation of hardware compiler 205 and/or hardware linker 210 in accordance with rules specified within makefile 265.

Hardware compiler 205 may operate on one or more different source files such as source files 250, 255, and 260. In one exemplary implementation, source file 260 may specify one or more kernels in OpenCL. Source file 255 may specify one or more kernels in C and/or C++. Source file 260 may specify circuitry such as a core (e.g., an Intellectual Property Core) as RTL.

Hardware compiler 205 may be configured to perform hardware compilation that generates an RTL translation of received source code files specified in one or more different high level programming languages. Hardware compiler 205 may generate an intermediate file for each received file. For example, hardware compiler 205 may generate intermediate file 270 for source file 250, intermediate file 275 for source file 255, and intermediate file 280 for source file 260.

In one aspect, intermediate files 270, 275, and 280 may specify an RTL implementation of the kernels specified in each corresponding source file. Thus, intermediate file 270 may include an RTL translation of the kernels specified in OpenCL in source file 250. Intermediate file 275 may include an RTL translation of the kernel(s) specified in C and/or C++ from source file 255. For example, hardware compiler 205 may utilize a Clang/LLVM pre-processor to parse source files 250 and 255. In one aspect, hardware compiler 205 may pass through source file 260 in the case where source file 260 includes RTL to become intermediate file 280. For example, source file 260 may be the same as, or equivalent to, intermediate file 280.

Hardware linker 210 may operate on intermediate files 270, 275, and 280 to generate an output file 285. In one arrangement, output file 285 may be referred to as an "*.xclbin" file. The "*.xclbin" file may be implemented as a binary file. The "*.xclbin" file, i.e., output file 285, is a single binary file may be implemented as a container to include a designated output as specified in makefile 265. The binary file may also include metadata for the designated output. In this example, the designated output may be hardware. Accordingly, output file 285 may include a circuit design such as a configuration bitstream. Possible outputs that may be included in output file 285 may include, but are not limited to, a configuration bitstream for hardware, one or more packaged IPs or cores for hardware emulation, or an executable for software emulation.

Continuing with the hardware example, hardware linker 210 may perform a design flow including synthesis, placement, and routing on intermediate files 270, 275, and 280. The resulting circuit design may include a compute unit circuit implementation for each kernel specified in source files 250, 255, and 260. In one aspect, the circuit design may be a configuration bitstream that may be loaded into a programmable IC to implement the compute unit circuit implementations within the programmable IC.

Synthesis refers to the process of converting, or translating, an abstract, programmatic description of a circuit into a low-level design implementation. The abstract, programmatic description of the circuit describes behavior of the circuit and is also referred to as a "behavioral description" or a "register transfer level (RTL) description" of the circuit. The behavioral description is often specified using a hardware description language (HDL). The low-level design implementation generated through synthesis typically is specified as inter-connected logic gates referred to as a netlist.

Synthesis may also include mapping. Mapping is the process of correlating, or matching, the logic gates of the low-level circuit design to the various types of circuit blocks or resources that are actually available in the target IC. For example, since a lookup table (LUT) may implement a complex function, one or more logic gates of the low-level design implementation may be mapped to a single LUT, or other programmable tile of the target IC. The mapped circuit design specifies the same functionality as the low-level design implementation, albeit in terms of the particular circuit blocks available on the target IC as opposed to low-level logic gates.

Placement is the process of assigning elements of the synthesized circuit design to particular instances of circuit blocks and/or resources having specific locations on the target IC. Once placed, a circuit element of the circuit design has a specific location on the target IC as opposed to only being assigned to a particular type of circuit block and/or resource as is the case after mapping and prior to placement. The location of a circuit element of a circuit design, once placed, is the location on the target IC of the instance of the circuit block and/or resource to which the circuit element is assigned. Routing is the process of selecting particular routing resources such as wires, programmable interconnection points (PIPs), PIP settings, and/or other interconnect circuitry to electrically couple the various circuit blocks of the target IC after placement. Hardware linker 210 may also generate the configuration bitstream, in this example, from the routed circuit design and generate output file 285 to include the configuration bitstream.

FIG. 2 illustrates an example where the source files may be specified using one or more different high level programming languages and hardware description languages. As such, a user need not rewrite a source file into a different high level programming language in order to utilize the source file for creating a circuit design. It should be appreciated, however, that each of the source files may be specified using a same high level programming language.

The example of FIG. 2 illustrates that the compilation flow may be implemented as a two stage process. The first stage may include hardware compilation where the source files are translated into an intermediate format such as RTL. The second stage may include hardware linking where the intermediate files may be synthesized, placed, and routed to create a circuit design.

As noted, the example of FIG. 2 illustrates the case where the target output is specified as hardware. The source files may be compiled into one of a plurality of different target outputs as specified in makefile 265. One target output may be hardware, e.g., a circuit design such as a configuration bitstream. Another target output may be software emulation where source files 250, 255, and 260 are compiled into intermediate files 270, 275, and 280, which specify object code. In that case, hardware compiler 205 may compile high level programming languages and/or RTL into object code. Hardware linker 210 may link intermediate files 270, 275, and 280 to generate a cycle accurate software emulation of the OpenCL design and/or kernels as an executable. It should be appreciate that when software emulation is specified as an output, conversion to RTL by hardware compiler 205 is not required.

Another target output may be hardware emulation. In the case of hardware emulation, the intermediate files from hardware compiler 205, which may be RTL files, may be packaged by hardware linker 210 into cores (e.g., IPs) that may be used for emulating hardware. The particular operations performed by EDA application 200 may depend upon the rules specified in makefile 265.

An example of a makefile for hardware implementation is illustrated in Example 1.

Example 1 xocc --xdevice xilinx:adm-pcie-7v3:1ddr:1.0 -t sw_emu -o kernel.xclbin kernel.cl
g++ main.cpp oclErrorCodes.cpp oclHelper.cpp host.c libxilinxopencl.so -o
host.exe
host.exe -d acc -k kernel.xclbin Example 1 includes a plurality of rules. Each rule may include one or more switches, also referred to as command line switches, for which parameters may be supplied. For example, in the first line, the "--xdevice" switch indicates that the parameter to follow specifies the particular target IC for which the circuit design is to be generated. The target IC specifies the particular model of programmable IC which may influence operation of hardware compiler 205 and/or hardware linker 210 to create an optimized circuit design for the target IC. In this example, the parameter for the "--xdevice" switch is "xilinx:adm-pcie-7v3:1ddr:1.0". The xdevice switch further may indicate a particular circuit infrastructure that may be implemented within the target IC concurrently with the hardware implementation of the kernels and to which the kernels may be coupled.

The "-t" or "--target" switch may take a parameter indicating the type of target output that is generated. Exemplary values for the "-t" switch may include "sw_emu" indicating software emulation, "hw_emu" indicating hardware emulation, or "hw" indicating hardware as discussed. If the "-t" switch is not listed, the default value of "hw" may be presumed. In this example, software emulation is specified. The system may generate an executable that may be used to perform cycle accurate simulation of the OpenCL design and/or the kernels as if implemented in hardware using programmable circuitry of the target IC.

The "-o" switch may take a parameter indicating a name of the output file that is generated. In this example, the output file is "kernel.xclbin" as specified by the "-o" switch. The input file used to generate the output file follows and is "kernel.cl". In this example, the input file is specified in OpenCL. The binary file including the software emulation executable is "kernel.xclbin".

The "-I" switch, which is not illustrated in Example 1, may take a parameter indicating an include directory for purposes of the compilation flow for hardware implementation.

Referring to the second line, the "g++" command causes the system to compile the host source code using a high level programming language compiler. In one aspect, hardware compiler 205 may compile the host source code into object code. Hardware linker 210 may link the host source code. The resulting output file of the host source code may be an executable "host.exe" and may be independent, or separate, from the binary file.

The third line is an example rule including an instruction to load the binary file "kernel.xclbin" built in line 1 using the host executable "host.exe" built in line 2.

Another example of a makefile for hardware implementation is illustrated in Example 2.

Example 2 compile kernel1.c <switches for kernel1c processing> -o kernel1.xo
compile kernel2.c <switches for kernel2.c processing> -o kernel2.xo
link kernel1.xo kernel2.xo -o kernels.xclbin In Example 2, the particular target IC is not specified for ease of illustration. The first rule specifies a "compile" command and indicates a source file called "kernel1.c". In this example, "kernel1.c" may specify a kernel in the C and/or C++ high level programming language. One or more switches may be specified and are generically illustrated as "<switches for kernel1.c processing>". The resulting output of the hardware compiler will be an intermediate file called "kernel1.xo" as specified using the "-o" switch. In this example, hardware may be presumed as the target output. In that case, the intermediate file kernel1.xo includes an RTL implementation of the kernel specified by the source file kernel1.c.

The second rule specifies a "compile" command and indicates a source file called "kernel2.c". In this example, "kernel2.c" may specify a kernel in the C and/or C++ high level programming language. One or more switches may be specified and are generically illustrated as "<switches for kernel2.c processing>". The resulting output of the hardware compiler will be an intermediate file called "kernel2.xo" as specified using the "-o" switch. As discussed, the intermediate file kernel2.xo includes an RTL implementation of the kernel specified by the source file kernel2.c.

The third rule specifies the command "link" and the intermediate files "kernel1.xo" and "kernel2.xo". The resulting output may include a circuit design expressed as a configuration bitstream as specified by the "-o" switch. The configuration bitstream may be included in a binary file called "kernels.xclbin" in this example.

For example, responsive to a command line input of "make", the system may execute the exemplary makefile. The various commands described within the rules, e.g., compile and link, may be executed with the appropriate timing to cause the system to perform the hardware compilation and hardware linking operations described.

Figure 3:
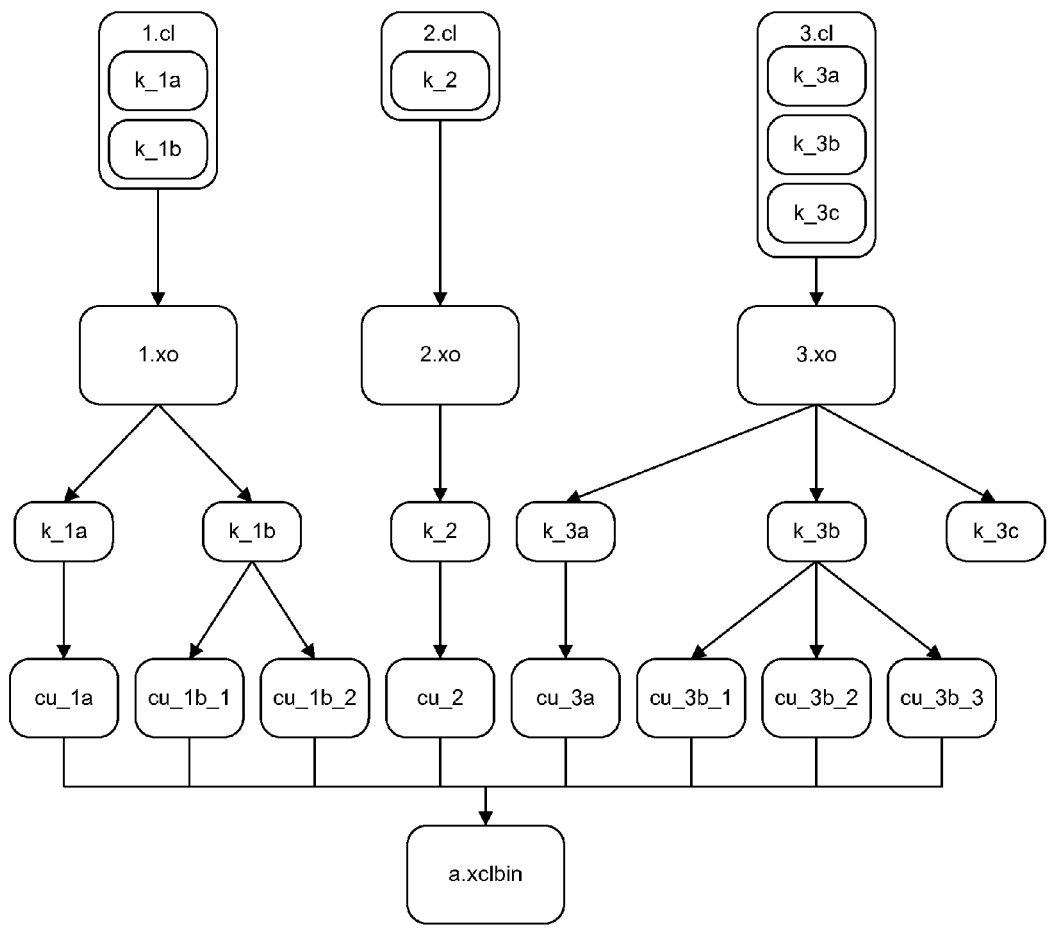
FIG. 3 is a block flow diagram illustrating another example of a compilation flow for hardware implementation.

FIG. 3 is a block flow diagram illustrating another example of a compilation flow for hardware implementation. FIG. 3 illustrates processing performed on source files 1.cl, 2.cl, and 3.cl. For purposes of illustration, the source files are specified in OpenCL, but may be specified in one or more different high level programming languages. In this example, source file 1.cl includes two kernels called k_1a and k_1b. Source file 2.cl includes a kernel called k_2. Source file 3.cl includes three kernels called k_3a, k_3b, and k_3c. For purposes of illustration, hardware is the target output.

A makefile provided to the system may include the following rules:
-compile <switches> -o 1.xo 1.cl#1.xo contains k_1a and k_1b
-compile <switches> -o 2.xo 2.cl #1.xo contains k_2
-compile <switches> -o 3.xo 3.cl #1.xo contains k_3a, k_3b, and k_3c The "compile" command causes the system to translate the high level programming language of the various files into RTL. As shown, the system may generate intermediate file 1.xo for source file 1.cl. Intermediate file 1.xo may specify kernels k_1a and k_1b in RTL. In one aspect, the system may automatically detect one or more different kernels and distinguish among the different kernels in a single source file. In this example, the system may automatically determine that source file 1.cl includes two kernels and generate an RTL translation for each detected kernel within intermediate file 1.xo.

The system may generate intermediate file 2.xo for source file 2.cl. Intermediate file 2.xo may specify kernel k_2 in RTL. Similarly, the system may generate intermediate file 3.xo for source file 3.cl. Intermediate file 3.xo may specify kernels k_3a, k_3b, and k_3c in RTL. For purposes of description, the "#" indicates that the text that follows on the line is a comment that is not utilized by the system for the compilation flow.

The makefile provided to the system further may include the following rule:
-link 1.xo 2.xo 3.xo -nk_k 1b:2 -nk_k_3b:3 k_3c:0 -o a.xclbin The "link" command causes the system to create a circuit design using the enumerated files. In this example, the system links, e.g., synthesizes, places, and routes, intermediate files 1.xo, 2.xo, and 3.xo. The hardware implementation of each kernel in the resulting circuit design may be called a compute unit (a "compute unit circuit implementation" of a kernel). The "-nk" switch indicates the number of instances, or copies, of a compute unit circuit implementation that are to be implemented or created for a given kernel in the resulting circuit design.

Referring to the above exemplary rule including the "link" command, the term "-nk_k_1b:2" indicates that the resulting circuit design should include 2 instances of the compute unit circuit implementation for the kernel k_1b. As pictured in FIG. 3, the kernel k_1b is used to create two instances of the compute unit circuit implementation shown as "cu_1b_1" and "cu_1b_2". In the event that an "-nk" switch is not specified for a kernel, the system may use a default value of one and create one instance of the compute unit circuit implementation for the kernel. Accordingly, one instance of a compute unit circuit implementation for kernel k_2, i.e., cu_2, is created.

The term "-nk_k 3b:3" indicates that the resulting circuit design should include 3 instances of the compute unit circuit implementation for kernel k_3b. As pictured in FIG. 3, the kernel k_3b is used to create three instances of the compute unit circuit implementation shown as "cu_3b_1", "cu_3b_2", and "cu_3c_3". The term "-nk_k_3c:0" indicates that the resulting circuit design should include no (i.e., 0) instances of the compute unit circuit implementation for the kernel k_3c.

The "link" command described above may include one or more other options that control the number of instances of a compute unit circuit implementation included in a circuit design. In another aspect, a switch may be specified, or a parameter of the "-nk" switch provided, that causes the system to determine an amount of unused space within the programmable circuitry, determine the size (or amount of resources needed to implement) a kernel, and fill the available space of the programmable circuitry with as many instances of the compute unit circuit implementation of the kernel that will fit within the unused programmable circuitry.

For example, the hardware linker may determine an estimate of the size of a single instance of the compute unit circuit implementation for a kernel and determine the number of instances that will fit in the unused portion of the programmable circuitry of the target IC. In another example, since the hardware linker may perform synthesis, placement, and routing, the hardware linker may determine a more exact estimate of the size of the instance and, based upon the more exact estimation, determine the number of instances that will fit in the unused portion of programmable circuitry of the target IC. The number of instance of the compute unit circuit implementation determined may then be created and included in the circuit design.

The system names the resulting binary file "a.xclbin" in accordance with the parameter provided following the "-o" switch. In this example, "a.xclbin" is the binary file including a configuration bitstream specifying a circuit implementation of the source files. The configuration bitstream may be a full configuration bitstream that implements the kernels as hardware in combination with infrastructure circuitry that may perform input/output functions for the target IC and hardware implementations of the kernels or a partial configuration bitstream that implements the kernels as hardware when loaded into the target IC.

Figure 4:
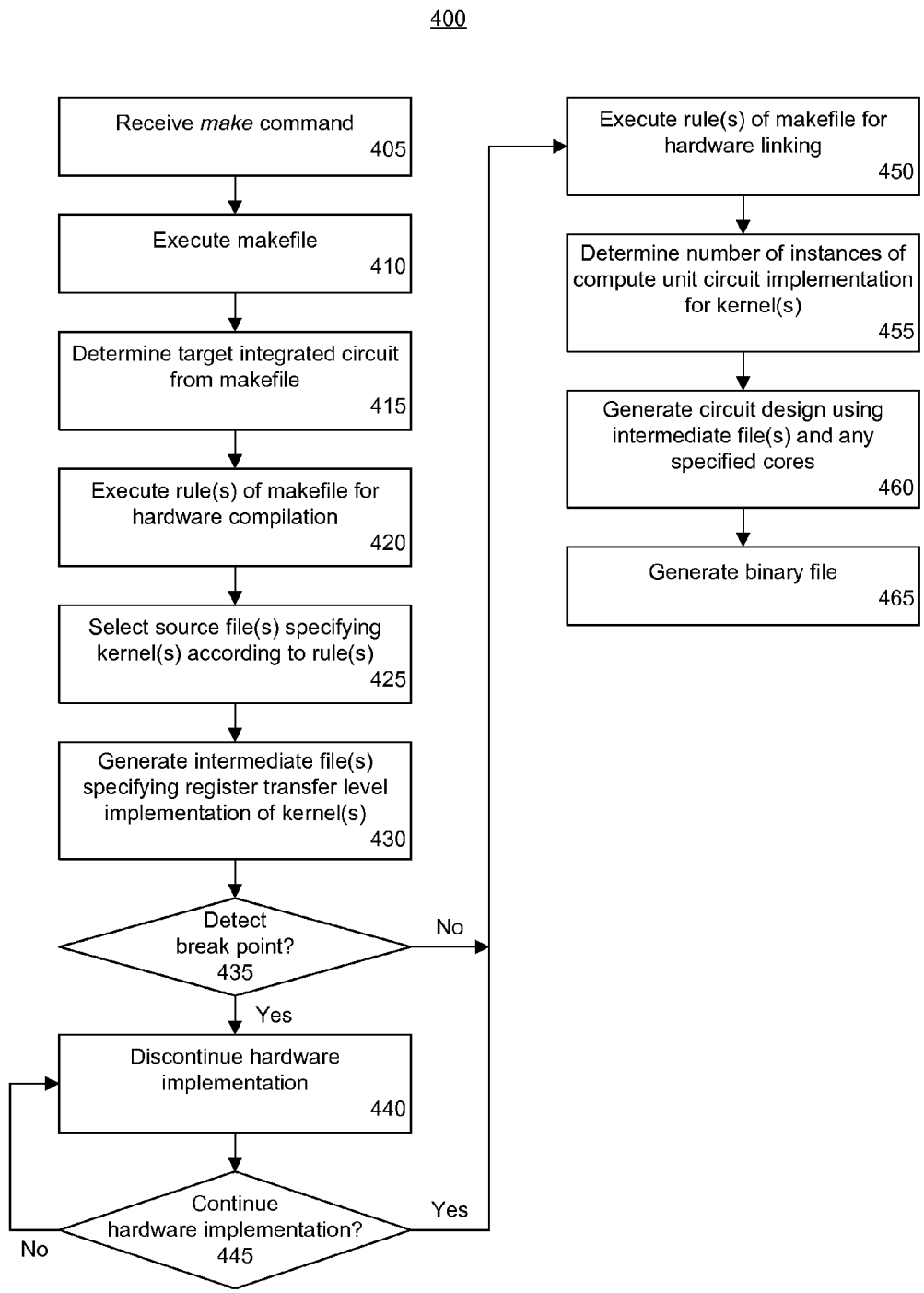
FIG. 4 is a flow chart illustrating an exemplary method of implementing a circuit design.

FIG. 4 is a flow chart illustrating an exemplary method 400 of implementing a circuit design. Method 400 may be performed by a system as described with reference to FIG. 1 of this specification. Method 400 illustrates a software development-based compilation flow for hardware implementation. Method 400 illustrates an example of a compilation flow for hardware implementation that utilizes a makefile development environment as described within this disclosure.

In block 405, the system may receive a make command. For example, a user may type the make command into a command line utility of the EDA application and/or a make utility that operates cooperatively with an EDA application as described. In block 410, the system may execute the makefile indicated by the make command. The makefile may include a plurality of rules that implement a compilation flow for hardware implementation. For example, the makefile may include one or more rules that control and/or implement hardware compilation and/or hardware linking to generate a circuit design.

In block 415, the system may determine the target IC from the makefile. In one aspect, the system may interpret a rule that specifies one or more options specifying the particular target IC. The options further may specify additional aspects such as the particular board on which the target IC may be mounted and the like.

In block 420, the system may execute one or more rules of the makefile for hardware compilation. For example, the system may execute one or more rules that include the "compile" command. In block 425, the system may select the source files, specified by the rules executed in block 420. The source files specify one or more kernels in a high level programming language. In block 430, the system may generate intermediate file(s) specifying RTL implementations of the kernels.

In one aspect, as part of blocks 425 and/or 430, the system may maintain a record of the particular version of each source file used to generate an intermediate file from prior executions of the makefile. The system may determine whether a source file has changed based upon whether the date and time stamp of the source file referenced in the executed rule(s) of the makefile is newer than the version used in a previous execution of the makefile. For example, if the date and time stamp of a source file is newer than the version of the source file used in a previous execution of the makefile, the system may compile the newer version of the source file to generate a new, or updated, intermediate file. If the date and time stamp of a source file is not newer, the system may determine that the previously generated intermediate file may be used since the source file is unchanged. In that case, for example, the system may skip the generation of the intermediate file for the unchanged source file and use the previously generated intermediate file for further processing.

In block 435, the system may determine whether a break point is detected. Break points may be specified within the makefile. In one aspect, the makefile may include a break point that instructs the system to discontinue hardware implementation following hardware compilation, e.g., generation of the intermediate file(s). Thus, responsive to detecting a break point indicating that the system should discontinue hardware implementation following hardware compilation, the system may discontinue hardware implementation or otherwise pause operation in block 440.

In block 445, the system may determine whether to continue with hardware implementation. In one aspect, the system may determine whether the user has provided a command to continue hardware implementation through the command line interface. If the system determines that hardware implementation should be continued, method 400 may continue to block 450. If not, method 400 may loop back to block 440.

In block 450, the system may execute one or more rules of the makefile for hardware linking. For example, the system may execute one or more rules that include the "link" command. The system may select the intermediate files specified by the rules executed in block 450. As discussed, each intermediate file includes one or more kernels in RTL.

In block 455, the system may determine the number of instances of compute unit circuit implementations of each kernel specified by the intermediate files to be implemented within the circuit design automatically. In one aspect, the number of instances of compute unit circuit implementations may be determined according to a parameter provided for a switch in one or more of the rules executed in block 450. In one aspect, the number of instances of a compute unit circuit implementation to be implemented within the circuit design for a kernel may be specified explicitly using a parameter for a switch or by excluding the instance determination switch altogether and relying on the default number of instances of the compute unit circuit implementation.

In another aspect, the rule(s) of block 450 may specify the number of instances of one or more compute unit circuit implementations for a kernel using a parameter and/or a switch that instructs the system to fill the unused portion of the programmable circuitry with as many instances of a particular compute unit circuit implementation for the kernel that may fit. For example, the system may determine the particular target IC as described in block 415 from the makefile. The system further may have an estimate of the size of an instance of a particular compute unit circuit implementation. The system may determine the amount of unused programmable circuitry which is the amount of programmable circuitry not used to implement any particular circuitry including instances of compute unit circuit implementations. The system may calculate the number of instances of the compute unit circuit implementation that may be formed in the unused portion of the programmable circuitry of the target IC.

In block 460, the system may link one or more intermediate files specified by the rules of block 450 and generate a circuit design using the specified intermediate files. The system further may include any cores that may be referenced or specified by the rules. In one aspect, the rules may specify intermediate files only. In another aspect, the hardware link rules may specify one or more intermediate files and one or more cores. The cores, for example, may be RTL cores, third party IP cores, or other third party circuit designs that may be incorporated into the resulting circuit design that is generated. The hardware implementations of the cores may be coupled to one or more of the compute unit circuit implementations with the resulting circuit design. The configuration bitstream may be generated to conform to the architecture of the target integrated circuit.

In one arrangement, the makefile, through one or more commands and/or switches, may indicate that the resulting circuit design should implement only the kernels and any other intermediate files that may be specified in the makefile. In that case, the resulting configuration bitstream may be a partial configuration bitstream that may be implemented within a dynamically reconfigurable region of the target IC, where the supporting circuitry is implemented as another configuration bitstream having a reconfigurable partition that the partial configuration bitstream is used to fill.

In another arrangement, the makefile, through one or more commands and/or switches, may indicate that the resulting circuit design should implement the kernels, other intermediate files specified in the makefile, and supporting circuitry. In that case, the system may generate a full configuration bitstream specifying the aforementioned circuitry.

In block 465, the system may generate the binary file. The system may include the configuration bitstream in the binary file. The system further may identify any drivers that may be necessary for a host system to communicate with the target IC, e.g., with the supporting circuitry implemented in the target IC. The system may include the drivers as supplemental data within the binary file in addition to the configuration bitstream.

Figure 5:
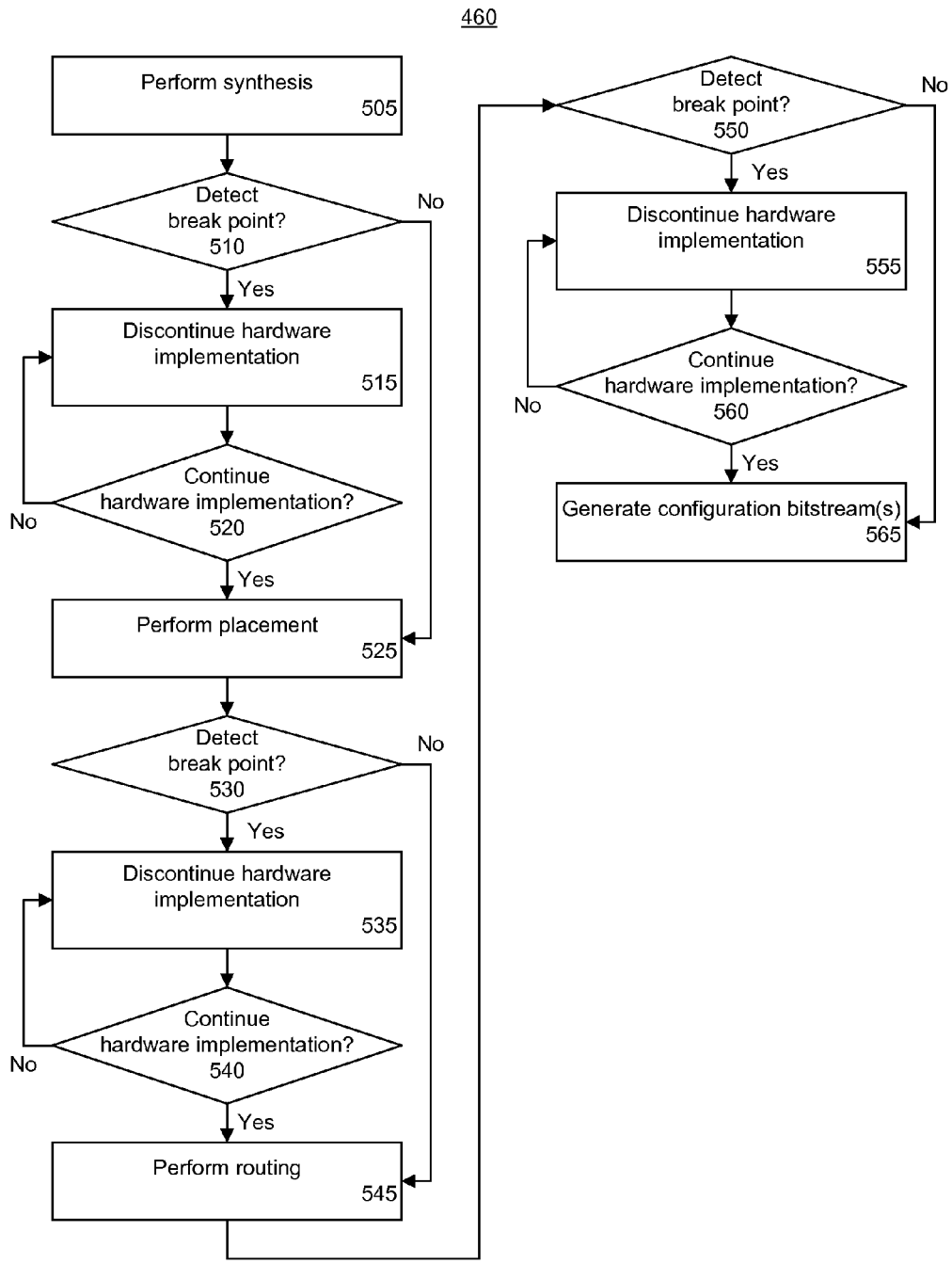
FIG. 5 is a flow chart illustrating an exemplary method of hardware linking.

FIG. 5 is a flow chart illustrating an exemplary implementation of block 460 of FIG. 4. FIG. 5 illustrates an example of how additional break points may be specified within the makefile. The breakpoints may cause the system to pause and/or discontinue operation at one or more different points within the hardware linking process. It should be appreciated that the synthesis, placement, routing, and configuration bitstream generation operations described with reference to FIG. 5 are performed for the architecture of the particular target IC specified in the makefile as described with reference to FIG. 4.

In block 505, the system may perform synthesis. The system may perform synthesis on the intermediate files and any cores that may have been specified. In block 510, the system may determine whether a break point is detected for pausing and/or discontinuing operation following synthesis. If so, the method may continue to block 515. If not the method may proceed to block 525.

In block 515, the system may discontinue and/or pause hardware implementation. In block 520, the system may determine whether to continue with hardware implementation. As discussed, the system, for example, may determine whether a continue command to continue has been received. If so, the method may continue to block 525. If not, method 460 may loop back to block 515.

In block 525, the system may perform placement. The system may perform placement on the synthesized intermediate files and any synthesized cores that may have been specified. In block 530, the system may determine whether a break point is detected for pausing and/or discontinuing operation following synthesis. If so, the method may continue to block 535. If not the method may proceed to block 545.

In block 535, the system may discontinue and/or pause hardware implementation. In block 540, the system may determine whether to continue with hardware implementation. As discussed, the system may determine whether a command to continue operation has been received. If so, the method may continue to block 545. If not, the method may loop back to block 535.

In block 545, the system may perform routing. The system may perform routing on the placed intermediate files and any placed cores that may have been specified. In block 550, the system may determine whether a break point is detected for pausing and/or discontinuing operation following routing. If so, the method may continue to block 555. If not method 460 may proceed to block 565.

In block 555, the system may discontinue and/or pause hardware implementation. In block 550, the system may determine whether to continue with hardware implementation. As discussed, the system, for example, may determine whether a command to continue operation has been received. If so, the method may continue to block 565. If not, method 460 may loop back to block 555.

In block 565, the system may generate a configuration bitstream. The resulting configuration bitstream includes the number of instances of the compute unit circuit implementations for the kernels as specified within the makefile. In one example, the configuration bitstream may be a partial configuration bitstream. In another example, the configuration bitstream may be a full configuration bitstream.

In the case of a partial configuration bitstream, the generated partial configuration bitstream may specify hardware implementations of the kernels as discussed. The partial configuration bitstream may be loaded into a programmable IC with another, e.g., a second, configuration bitstream. In one example, the second configuration bitstream may provide the necessary interfaces for the target IC to communicate with external systems, e.g., the host of the OpenCL design. The partial configuration bitstream generated in block 565, for example, may be implemented to couple to, or interface with, the second partial configuration bitstream.

In one aspect, the system may generate the kernels as a partial configuration bitstream as described and further generate the second configuration bitstream automatically. Both partial configuration bitstreams may be output from the system.

In the case where the configuration bitstream generated in block 565 is a full configuration bitstream, the configuration bitstream may include the necessary interface circuitry that couples the hardware implementations of the kernels with external systems such as the host of the OpenCL design. For example, the makefile may specify the target IC and the particular model of circuit board on which the target IC may be implemented. Accordingly, the system may automatically include the necessary I/O circuit blocks for the compute unit circuit implementations of the kernels to communicate with one or more other external systems through the circuit board. In another aspect, one or more of the cores previously described may be circuitry that implements the necessary I/O circuit blocks for the compute unit circuit implementations of the kernels to communicate with one or more other external systems through the circuit board.

Figure 6:
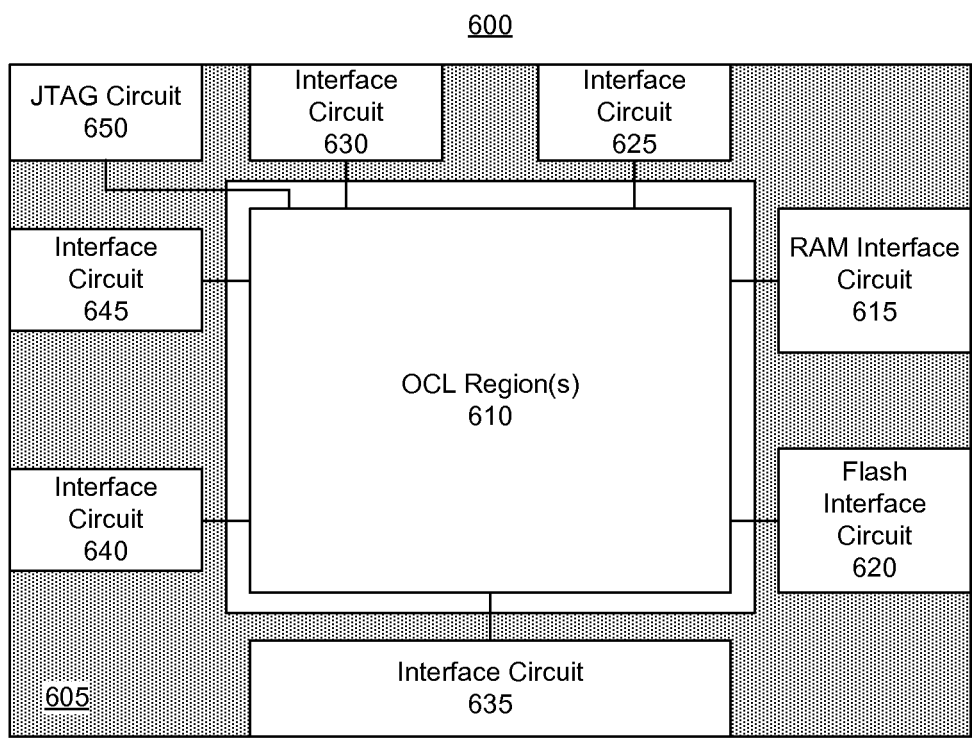
FIG. 6 is a block diagram illustrating an exemplary IC including a first region and an OpenCL (OCL) region.

FIG. 6 is a block diagram illustrating an exemplary IC 600 including a region 605 and one or more OpenCL (OCL) regions 610. IC 600 may be implemented as a programmable IC such as a field programmable gate array (FPGA) or the like.

Region 605 is indicated with shading. The various circuit blocks within the shaded portion of programmable IC 600 are part of region 605. For example, region 605 may include a RAM interface circuit 615 (e.g., a RAM memory controller), a flash interface circuit 620 (e.g., a flash memory controller), and interface circuits 625, 630, 635, 640, and 645. Region 605 may also include a JTAG circuit 650. OCL regions 610 are not part of or included within static region 605. For purposes of illustration, interface circuits 625 and 630 may be SATA (Serial AT Attachment) interface circuits. Interface circuits 640 and 645 may be 10 gigabit Ethernet interface circuits. Interface circuit 635 may be a PCIe (Peripheral Component Interconnect Express) interface circuit. JTAG (Joint Test Action Group) circuit 650 may be a JTAG interface circuit or port.

Region 605 may implement the structural and/or input/output circuitry described herein that supports hardware implementations of kernels. OCL region(s) 610 represent the area in which hardware implementations of kernels may be implemented. In one arrangement, a full configuration bitstream may be generated and included within the binary file to implement both region 605 and OCL region(s) 610. In another arrangement, region 605 may be implemented as a static region in terms of performing partial reconfiguration. In that case, OCL regions 610 may be implemented as a dynamically reconfigurable region. As such, the hardware implementations of the kernel may be specified as one or more partial configuration bitstreams that may be loaded without interrupting operation of region 605. In either case, drivers that allow the host to interact with the various interfaces illustrated in FIG. 6 may be included as supplemental data within the binary file.

Figure 7:
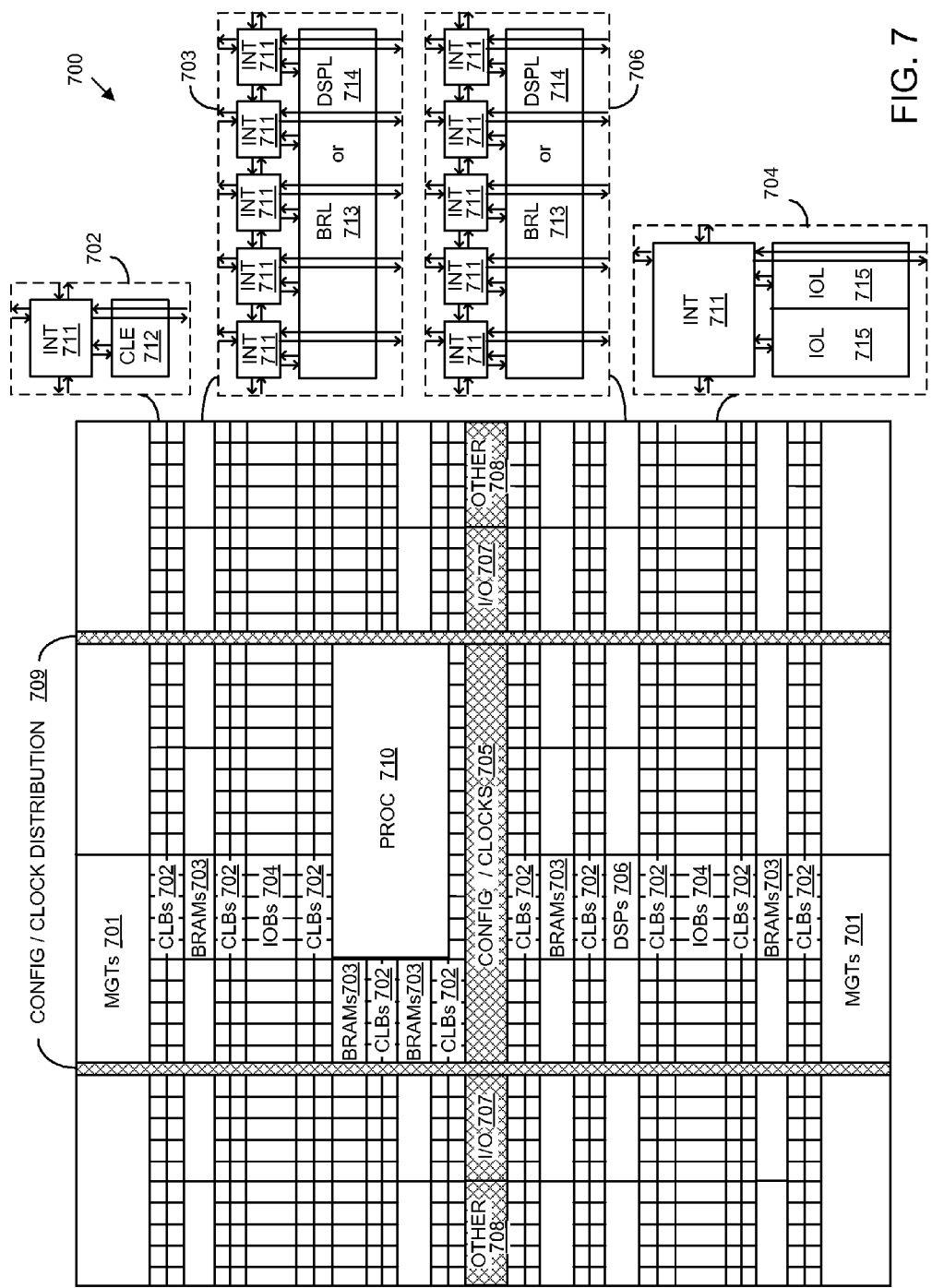
FIG. 7 is a block diagram illustrating an exemplary architecture for an integrated circuit.

FIG. 7 is a block diagram illustrating an exemplary architecture 700 for an IC. In one aspect, architecture 700 may be implemented within a programmable IC. The programmable IC may be used as the target IC for implementing hardware implementations of kernels as described within this specification. In one example, architecture 700 may be used to implement an FPGA. The example of FIG. 6 may be implemented using an architecture the same as or similar to that of FIG. 7.

Architecture 700 may also be representative of a system-on-chip (SOC) type of IC. An SOC is an IC that includes a processor that executes program code and one or more other circuits. The other circuits may be implemented as hard-wired circuitry, programmable circuitry, and/or a combination thereof. The circuits may operate cooperatively with one another and/or with the processor. It should be appreciated that in one aspect, the host program code of an OpenCL design may be implemented by a processor that is external to the target IC. For example, the target IC may not include a processor that is capable of executing program code as further explained below. In another aspect, however, the architecture of the target IC may include a processor. In that case, the host program code may be executed on the target IC while the instances of the compute unit circuit implementations of the kernel(s) are implemented within the programmable circuitry of the same target IC.

As shown, architecture 700 includes several different types of programmable circuit, e.g., logic, blocks. For example, architecture 700 may include a large number of different programmable tiles including multi-gigabit transceivers (MGTs) 701, configurable logic blocks (CLBs) 702, random access memory blocks (BRAMs) 703, input/output blocks (IOBs) 704, configuration and clocking logic (CONFIG/CLOCKS) 705, digital signal processing blocks (DSPs) 706, specialized I/O blocks 707 (e.g., configuration ports and clock ports), and other programmable logic 708 such as digital clock managers, analog-to-digital converters, system monitoring logic, and so forth.

In some ICs, each programmable tile includes a programmable interconnect element (INT) 711 having standardized connections to and from a corresponding INT 711 in each adjacent tile. Therefore, INTs 711, taken together, implement the programmable interconnect structure for the illustrated IC. Each INT 711 also includes the connections to and from the programmable logic element within the same tile, as shown by the examples included at the top of FIG. 7.

For example, a CLB 702 may include a configurable logic element (CLE) 712 that may be programmed to implement user logic plus a single INT 711. A BRAM 703 may include a BRAM logic element (BRL) 713 in addition to one or more INTs 711. Typically, the number of INTs 711 included in a tile depends on the height of the tile. As pictured, a BRAM tile has the same height as five CLBs, but other numbers (e.g., four) also may be used. A DSP tile 706 may include a DSP logic element (DSPL) 714 in addition to an appropriate number of INTs 711. An IOB 704 may include, for example, two instances of an I/O logic element (IOL) 715 in addition to one instance of an INT 711. The actual I/O pads connected to IOL 715 may not be confined to the area of IOL 715.

In the example pictured in FIG. 7, a columnar area near the center of the die, e.g., formed of regions 705, 707, and 708, may be used for configuration, clock, and other control logic. Horizontal areas 709 extending from this column may be used to distribute the clocks and configuration signals across the breadth of the programmable IC.

Some ICs utilizing the architecture illustrated in FIG. 7 include additional logic blocks that disrupt the regular columnar structure making up a large part of the IC. The additional logic blocks may be programmable blocks and/or dedicated circuitry. For example, a processor block depicted as PROC 710 spans several columns of CLBs and BRAMs.

In one aspect, PROC 710 may be implemented as dedicated circuitry, e.g., as a hardwired processor, that is fabricated as part of the die that implements the programmable circuitry of the IC. PROC 710 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 710 may be omitted from architecture 700 and replaced with one or more of the other varieties of the programmable blocks described. In some cases, such blocks may be utilized to form a "soft processor" in that the various blocks of programmable circuitry may be used to form a processor that can execute program code as is the case with PROC 710.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 7 that are external to PROC 710 such as CLBs 702 and BRAMs 703 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 710.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SOC, the configuration bitstream may specify the circuitry that is to be implemented within the programmable circuitry and the program code that is to be executed by PROC 710 or a soft processor. In some cases, architecture 700 includes a dedicated configuration processor that loads the configuration bitstream to the appropriate configuration memory and/or processor memory. The dedicated configuration processor does not execute user-specified program code. In other cases, architecture 700 may utilize PROC 710 to receive the configuration bitstream, load the configuration bitstream into appropriate configuration memory, and/or extract program code for execution.

FIG. 7 is intended to illustrate an exemplary architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 7 are purely exemplary. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 710 within the IC are for purposes of illustration only and are not intended as limitations.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system.

As defined herein, the term "executable operation" or "operation" is a task performed by a data processing system or a processor within a data processing system unless the context indicates otherwise. Examples of executable operations include, but are not limited to, "processing," "computing," "calculating," "determining," "displaying," "comparing," or the like. In this regard, operations refer to actions and/or processes of the data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

As defined herein, the term "high level programming language" means a programming language, or set of instructions, used to program a data processing system where the instructions have a strong abstraction from the details of the data processing system, e.g., machine language. For example, a high level programming language may automate or hide aspects of operation of the data processing system such as memory management. The amount of abstraction typically defines how "high level" the programming language is. Using a high level programming language frees the user from dealing with registers, memory addresses, and other low level features of the data processing system upon which the high level programming language will execute. In this regard, a high level programming language includes little or no instructions that translate directly, on a one-to-one basis, into a native opcode of a data processing system. Examples of high level programming languages include, but are not limited to, C, C++, SystemC, OpenCL, or the like.

As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the term "output" means storing in physical memory elements, e.g., devices, writing to display or other peripheral output device, sending or transmitting to another system, exporting, or the like. As defined herein, the term "plurality" means two or more than two. As defined herein, the term "user" means a human being. The terms first, second, etc. may be used herein to describe various elements. These elements should not be limited by these terms, as these terms are only used to distinguish one element from another unless stated otherwise or the context clearly indicates otherwise.

In some instances, the term "signal" may be used within this disclosure to describe physical structures such as terminals, pins, signal lines, wires. In other instances, the term "signal" may be used to refer to particular values specified by a wire. The term "signal" may refer to the conveyance of a single bit, e.g., a single wire, or the conveyance of multiple parallel bits through multiple parallel wires. Further, each signal may represent bi-directional communication between two, or more, components connected by the signal.

A computer program product may include a computer readable storage medium (or media) having computer readable program instructions thereon for causing a processor to carry out aspects of the inventive arrangements described herein. Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, state-setting data, or either source code or object code written in any combination of one or more programming languages, including an object oriented programming language and/or procedural programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method may include executing, using a processor, a makefile including a plurality of rules for hardware implementation and, responsive to executing a first rule of the plurality of rules, selecting a source file including a kernel specified in a high level programming language, and generating, using the processor, an intermediate file specifying an RTL implementation of the kernel. The method may include, responsive to executing a second rule of the plurality of rules, generating, using the processor, a configuration bitstream for a target IC from the intermediate file. The configuration bitstream may include a compute unit circuit implementation of the kernel.

The configuration bitstream may be generated responsive to determining that hardware is specified as a target option in at least one of the plurality of rules.

In one arrangement, the makefile may specify the target IC and the configuration bitstream may be generated to conform to an architecture of the target IC.

Generating the configuration bitstream may include synthesizing, placing, and routing the intermediate file. Generating the configuration bitstream may also include determining a number of instances of the compute unit circuit implementation to include in the configuration bitstream and creating the number of instances of the compute unit circuit implementation within the configuration bitstream. In one arrangement, the number of instances of the compute unit circuit implementation may be specified as a parameter of a command line switch within the second rule. In another arrangement, the number of instances of the compute unit circuit implementation to include in the configuration bitstream may be determined according to a comparison of implementation requirements for an instance of the compute unit circuit implementation with unused space in programmable circuitry of the target IC.

The method may include discontinuing hardware implementation following generation of the intermediate file responsive to a break point within the makefile.

The method may also include discontinuing hardware implementation following at least one of synthesis, placement, or routing responsive to a break point within the makefile.

In another aspect, the source file may include a plurality of kernels. Accordingly, generating the intermediate file may include generating an RTL implementation of each of the plurality of kernels. The configuration bitstream may include at least one instance of a compute unit circuit implementation for each of the plurality of kernels.

The method may include receiving a core specifying a circuit block and generating a circuit implementation of the core as part of the configuration bitstream.

The method further may include generating a binary file including the configuration bitstream and a driver executable by the host for communicating with the target IC.

A system may include a processor programmed to initiate executable operations. The executable operations may include executing a makefile including a plurality of rules for hardware implementation and, responsive to executing a first rule of the plurality of rules, selecting a source file including a kernel specified in a high level programming language, and generating an intermediate file specifying an RTL implementation of the kernel. The executable operations may also include, responsive to executing a second rule of the plurality of rules, generating a configuration bitstream for a target IC from the intermediate file. The configuration bitstream may include a compute unit circuit implementation of the kernel.

In one aspect, the configuration bitstream is generated responsive to determining that hardware is specified as a target option in at least one of the plurality of rules.

The makefile may specify the target IC. The configuration bitstream may be generated to conform to an architecture of the target IC.

Generating the configuration bitstream may include synthesizing, placing, and routing the intermediate file. Generating the configuration bitstream may also include determining a number of instances of the compute unit circuit implementation to include in the configuration bitstream and creating the number of instances of the compute unit circuit implementation within the configuration bitstream. In one arrangement, the number of instances of the compute unit circuit implementation is specified as a parameter of a command line switch within the second rule. In another arrangement, the number of instances of the compute unit circuit implementation to include in the configuration bitstream is determined according to a comparison of implementation requirements for an instance of the compute unit circuit implementation with unused space in programmable circuitry of the target IC.

In another aspect, the source file may include a plurality of kernels. Accordingly, generating the intermediate file may include generating an RTL implementation of each of the plurality of kernels. The configuration bitstream may include at least one instance of a compute unit circuit implementation for each of the plurality of kernels.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the embodiments disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
executing, using a processor, a makefile comprising a plurality of rules executable to control operation of a hardware compiler and a hardware linker for hardware implementation, wherein the rules include a plurality of command line switches and corresponding parameters;
responsive to executing a first rule of the plurality of rules from the makefile using the processor, wherein the makefile specifies a source file comprising a kernel specified in a high level programming language, generating, by executing the hardware compiler, an intermediate file specifying a register transfer level implementation of the kernel, wherein the intermediate file is stored in a memory; and
responsive to executing a second rule of the plurality of rules of the makefile using the processor, generating, by executing the hardware linker, a configuration bitstream for a target integrated circuit from the intermediate file, wherein the target integrated circuit is specified by a first command line switch of the plurality of command line switches and a corresponding parameter within the makefile;
wherein the configuration bitstream comprises a compute unit circuit implementation of the kernel.

2. The method of claim 1, wherein the configuration bitstream is generated responsive to determining that hardware is specified by a second command line switch of the plurality of command line switches and a corresponding parameter within the makefile.

3. The method of claim 1, wherein:
the configuration bitstream is generated to conform to an architecture of the target integrated circuit.

4. The method of claim 1, further comprising:
responsive to executing a selected rule of the makefile specifying a second command line switch of the plurality of command line switches, coupling a circuit infrastructure specified by a parameter corresponding to the second command line switch to the kernel.

5. The method of claim 1, wherein the generating the configuration bitstream comprises:
determining a number of instances of the compute unit circuit implementation to include in the configuration bitstream based upon a second command line switch of the plurality of command line switches and a corresponding parameter within the makefile; and
creating the number of instances of the compute unit circuit implementation within the configuration bitstream.

6. The method of claim 5, wherein the number of instances of the compute unit circuit implementation is specified as the parameter of the second command line switch.

7. The method of claim 5, wherein the number of instances of the compute unit circuit implementation to include in the configuration bitstream is determined according to a comparison of implementation requirements for an instance of the compute unit circuit implementation with unused space in programmable circuitry of the target integrated circuit.

8. The method of claim 1, further comprising:
discontinuing hardware implementation following generation of the intermediate file responsive to a break point within the makefile.

9. The method of claim 1, further comprising:
discontinuing hardware implementation following at least one of synthesis, placement, or routing responsive to a break point within the makefile.

10. The method of claim 1, wherein:
the source file comprises a plurality of kernels;
the generating the intermediate file comprises generating a register transfer level implementation of each of the plurality of kernels; and
the configuration bitstream comprises at least one instance of a compute unit circuit implementation for each of the plurality of kernels.

11. The method of claim 1, further comprising:
generating a circuit implementation of the core as part of the configuration bitstream.

12. The method of claim 1, further comprising:
generating a binary file including the configuration bitstream and a driver executable by the host for communicating with the target integrated circuit.

13. A system, comprising:
a processor programmed to initiate executable operations comprising:
executing a makefile comprising a plurality of rules executable to control operation of a hardware compiler and a hardware linker for hardware implementation, wherein the rules include a plurality of command line switches and corresponding parameters;
responsive to executing a first rule of the plurality of rules from the makefile specifying a source file comprising a kernel specified in a high level programming language, generating, by controlled execution of the hardware compiler, an intermediate file specifying a register transfer level implementation of the kernel, wherein the intermediate file is stored in a memory; and
responsive to executing a second rule of the plurality of rules of the makefile, generating, by controlled execution of the hardware linker, a configuration bitstream for a target integrated circuit from the intermediate file, wherein the target integrated circuit is specified by a first command line switch of the plurality of command line switches and a corresponding parameter within the makefile;
wherein the configuration bitstream comprises a compute unit circuit implementation of the kernel.

14. The system of claim 13, wherein the configuration bitstream is generated responsive to determining that hardware is specified by a second command line switch of the plurality of command line switches and a corresponding parameter within the makefile.

15. The system of claim 13, wherein:
the configuration bitstream is generated to conform to an architecture of the target integrated circuit.

16. The system of claim 13, wherein the processor is configured to initiate further executable operations comprising:
responsive to executing a selected rule of the makefile specifying a second command line switch of the plurality of command line switches, coupling a circuit infrastructure specified by a parameter corresponding to the second command line switch to the kernel.

17. The system of claim 13, wherein the generating the configuration bitstream comprises:

determining a number of instances of the compute unit circuit implementation to include in the configuration bitstream based upon a second command line switch of the plurality of command line switches and a corresponding parameter within the makefile; and creating the number of instances of the compute unit circuit implementation within the configuration bitstream.

18. The system of claim 17, wherein the number of instances of the compute unit circuit implementation is specified as the parameter of the second command line switch.

19. The system of claim 17, wherein the number of instances of the compute unit circuit implementation to include in the configuration bitstream is determined according to a comparison of implementation requirements for an instance of the compute unit circuit implementation with unused space in programmable circuitry of the target integrated circuit.

20. The system of claim 13, wherein:
the source file comprises a plurality of kernels;
the generating the intermediate file comprises generating a register transfer level implementation of each of the plurality of kernels; and
the configuration bitstream comprises at least one instance of a compute unit circuit implementation for each of the plurality of kernels.

* * * * *